US 6,546,517 B1

(12) United States Patent
Yoshimura

(10) Patent No.: US 6,546,517 B1
(45) Date of Patent: *Apr. 8, 2003

(54) SEMICONDUCTOR MEMORY

(75) Inventor: Yoshimasa Yoshimura, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/488,676

(22) Filed: Jan. 21, 2000

(30) Foreign Application Priority Data

Jul. 15, 1999 (JP) ............................. 11-201617

(51) Int. Cl.$^7$ .............................................. G11C 29/00
(52) U.S. Cl. ....................................................... 714/763
(58) Field of Search ............................... 714/763, 718; 365/200, 201

(56) References Cited

U.S. PATENT DOCUMENTS

| | | | | | |
|---|---|---|---|---|---|
| 4,484,303 A | * | 11/1984 | Provanzano et al. | ............ | 712/37 |
| 5,511,164 A | * | 4/1996 | Brunmeier et al. | ............ | 714/53 |
| 5,606,660 A | * | 2/1997 | Estakhri et al. | ............... | 714/38 |
| 5,659,801 A | * | 8/1997 | Kopsaftis | ...................... | 710/62 |
| 5,680,537 A | * | 10/1997 | Byers et al. | .................... | 714/5 |
| 5,680,645 A | * | 10/1997 | Russell et al. | ................. | 710/48 |
| 5,826,075 A | * | 10/1998 | Bealkowski et al. | ......... | 713/187 |
| 5,835,933 A | * | 11/1998 | Wells et al. | ................. | 711/103 |
| 5,878,256 A | * | 3/1999 | Bealkowski et al. | ............ | 713/2 |
| 6,253,281 B1 | * | 6/2001 | Hall | ............................ | 711/112 |

FOREIGN PATENT DOCUMENTS

| JP | 01121933 | 5/1989 | | |
|---|---|---|---|---|
| JP | 10269075 A | * 10/1998 | .............. | G06F/9/06 |

* cited by examiner

Primary Examiner—Christine T. Tu
Assistant Examiner—Joseph D. Torres
(74) Attorney, Agent, or Firm—Oblon, Spivak, McClelland, Maier & Neustadt, P.C.

(57) ABSTRACT

An external memory includes a RAM of a fixed size for storing firmware, and a flash memory group. Since the flash memory group is accessible on a block-by-block basis, a plurality of program codes each corresponding to one processing routine are individually accessible. The RAM includes a first storage region (91) serving as a dynamic load area to which a program code stored in each block of the flash memory group is exclusively loaded. The exclusive loading of the plurality of program codes each corresponding to the respective one processing routine to the first storage region allows a smaller required size of the RAM. Since the flash memory group is rewritable, the firmware may be subjected to modification and version update. In this case, the required size of the RAM is not increased. Therefore, the external memory can store the firmware of a size exceeding the fixed size of the RAM.

15 Claims, 4 Drawing Sheets

F I G . 4
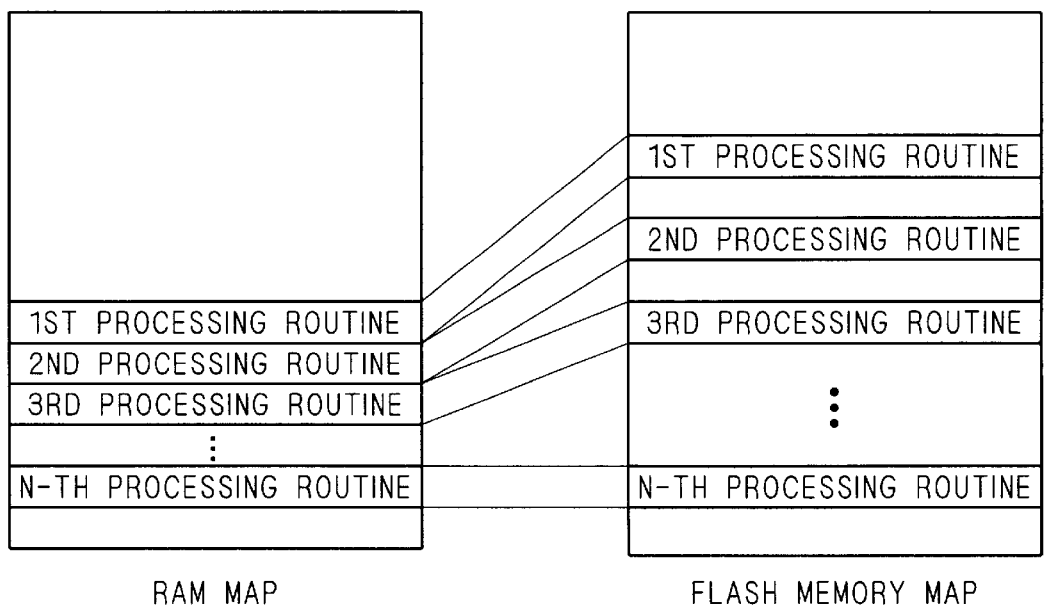

SEMICONDUCTOR MEMORY

BACKGROUND OF THE INVENTION

1. Field of the Invention

The present invention relates to a semiconductor memory and, more particularly, to a semiconductor disk device and a flash ATA (AT attachment) card which employ, for example, flash memories.

2. Description of the Background Art

Traditionally, a semiconductor disk device, a flash ATA card and the like have been proposed as external memories for computers, and comprise bulk flash memories for storing data therein and a controller for controlling the bulk flash memories.

The controller includes a CPU (central processing unit) and a firmware memory for storing programs known as firmware. The use of a ROM (read-only memory) as the firmware memory is disadvantageous in that firmware is not readily modified since every modification and every version update of the firmware require the ROM to be remade. A technique which uses a RAM (random access memory) as the firmware memory has hence been proposed such that firmware previously stored in part of flash memories is loaded to the RAM at power-on and a program loaded to the RAM is executed.

FIG. 4 conceptually illustrates a relationship between a RAM map and a flash memory map when the above described technique is employed. The firmware stored in the flash memories as illustrated in the flash memory map is loaded to the RAM as illustrated in the RAM map when power is turned on. Such a method is advantageous in that modification and version update of the firmware are readily carried out by rewriting the firmware to be stored in the flash memories.

However, the use of the above described method requires the preparation of a RAM capacity of a size large enough to store the firmware. If a program size increases because of the modification of the firmware or the addition of a function to the firmware to exceed the prepared capacity of the RAM, it is impossible to equip the external memory with the modified firmware. On the other hand, there is a demand for minimizing the RAM size which influences costs.

A technique of selectively loading a plurality of program codes is disclosed in, for example, Japanese Patent Application Laid-Open No. P01-121933A (1989).

SUMMARY OF THE INVENTION

According to a first aspect of the present invention, a semiconductor memory comprises: a nonvolatile semiconductor storage section having a plurality of rewritable, individually accessible blocks for individually storing therein a plurality of program codes each corresponding to one process, respectively; a RAM including a first storage region for mutually exclusively storing the plurality of program codes therein; and an error correcting section connected between the RAM and the nonvolatile semiconductor storage section and for transferring one of the plurality of program codes to the RAM while performing error correction upon the one of the plurality of program codes.

Preferably, according to a second aspect of the present invention, in the semiconductor memory of the first aspect, the RAM further includes a second storage region for storing therein a starting address of each of the plurality of blocks.

Preferably, according to a third aspect of the present invention, in the semiconductor memory of the first or second aspect, each of the plurality of program codes is associated with a command provided from an outside of the semiconductor memory.

The semiconductor memory according to the first aspect of the present invention is designed such that the modification of firmware or the addition of a function of the firmware require only the modification of the nonvolatile semiconductor storage section, eliminating the need to remake the ROM. Additionally, the semiconductor memory of the first aspect is high in expandability since the increase in the size of a program provided by the modification of the firmware or the addition of a function of the firmware does not require the increase in the capacity of the first storage region of the RAM, and is low in costs because of the provision of a greater number of functions with a smaller RAM capacity. Furthermore, the error correction is performed on the program being transferred from the nonvolatile semiconductor storage section to the RAM, to preclude a program in which an uncorrectable error occurs from being loaded to the RAM.

In the semiconductor memory according to the second aspect of the present invention, the starting addresses of the respective blocks are stored in the second storage region before the program codes are loaded. This eliminates the need to access the nonvolatile semiconductor storage section each time one of the program codes is stored in the first storage region, achieving rapid operation.

The semiconductor memory according to the third aspect of the present invention can easily add a function without remaking the ROM and increasing the size of the RAM capacity if there is a need to support a new command because of a review of specifications or the addition of an option.

It is therefore an object of the present invention to provide an external memory including a RAM of a fixed size serving as a memory for storing firmware and capable of being equipped with firmware of a size exceeding the fixed size of the RAM, thereby to provide a system which is low in costs and easy in modification of multifunctional firmware.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 conceptually illustrates a background art relationship between the RAM map and the flash memory map.

DESCRIPTION OF THE PREFERRED EMBODIMENTS

Figure 1:
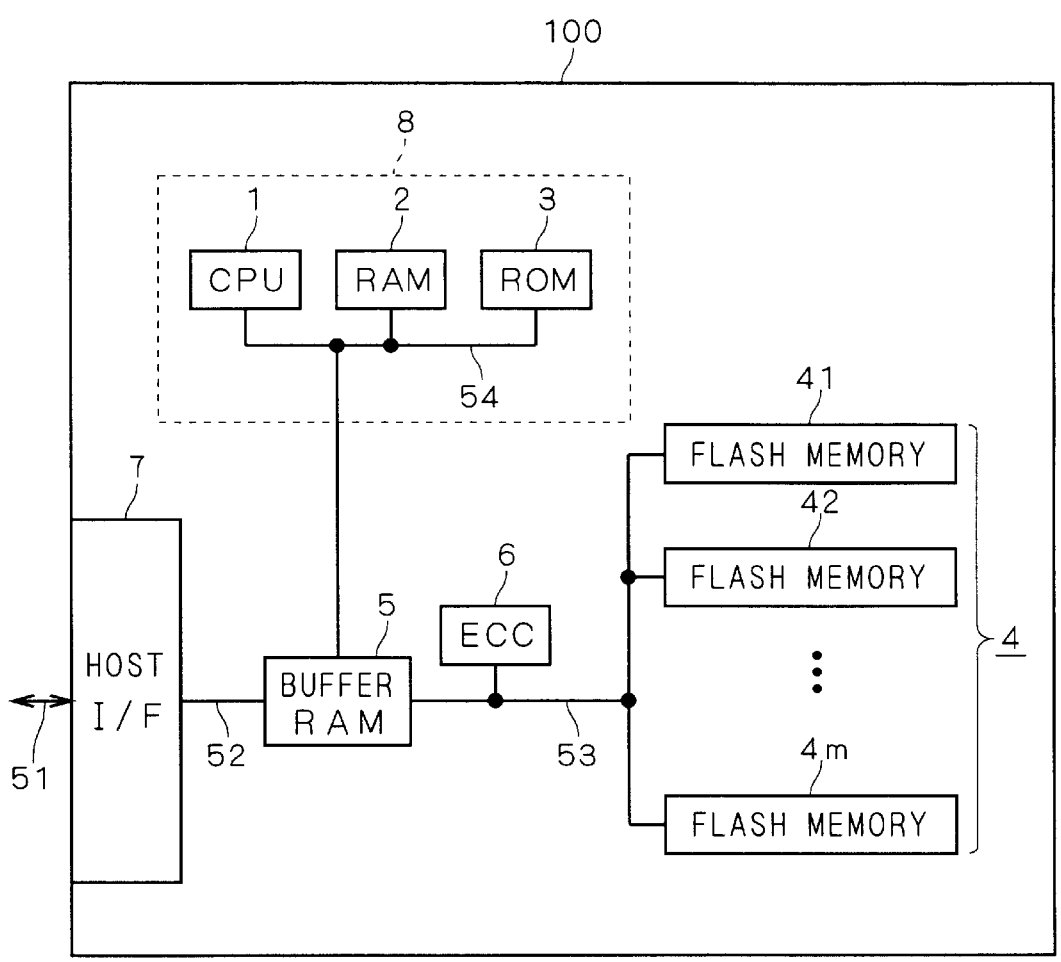
FIG. 1 is a block diagram of a semiconductor memory according to a preferred embodiment of the present invention.

FIG. 1 is a block diagram of a flash ATA card 100 illustrated as a semiconductor memory according to a preferred embodiment of the present invention. The flash ATA card 100 is connected to an external device through an ATA bus 51, and comprises a host interface 7 connected to the ATA bus 51. A command is inputted from an external host computer through the ATA bus 51 and the host interface 7 to a host bus 52, and data is outputted from the ATA bus 51 to the external host computer.

The flash ATA card 100 further comprises a buffer RAM 5 connected to the host interface 7 through the host bus 52, a flash memory group 4 connected to the buffer RAM 5 through a flash bus 53, and a controller 8 connected to the buffer RAM 5 through a CPU bus 54.

The flash memory group 4 is constructed to be accessible on a block-by-block (sector-by-sector) basis to meet a bulk data storage application. For example, the flash memory group 4 comprises a plurality of flash memories 41, 42, . . . , 4m. Of course, the flash memory group 4 may consist of a single flash memory if it is accessible on a block-by-block basis. The controller 8 comprises a CPU 1, a RAM 2 and a ROM 3 which are connected to each other through the CPU bus 54.

Figure 2:
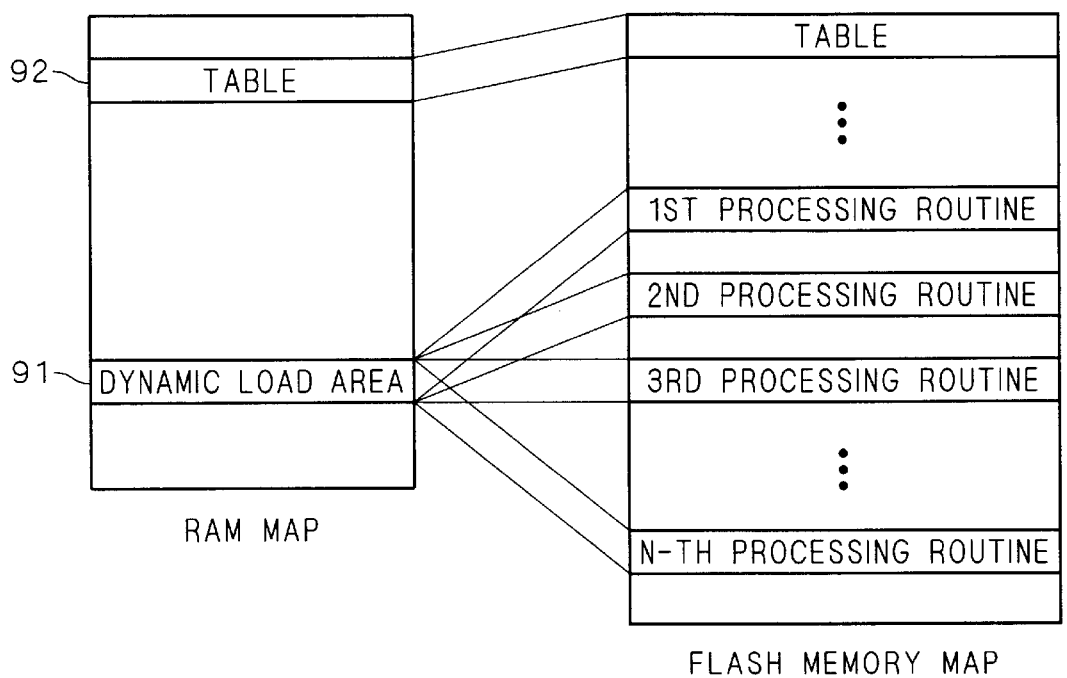
FIG. 2 conceptually illustrates a relationship between a RAM map and a flash memory map according to the preferred embodiment of the present invention.

FIG. 2 conceptually illustrates a relationship between a RAM map and a flash memory map in the flash ATA card 100. Firmware stored in the flash memories as illustrated in the flash memory map has a plurality of program codes corresponding respectively to first to N-th processing routines, e.g., differing from each other, and each of the program codes is stored in a single block. For purposes of convenience, locations in which the program codes are stored are represented in FIG. 2 by their corresponding processing routines, respectively.

Since the flash memory group 4 is accessible on a block-by-block basis, the plurality of program codes each corresponding to one processing routine are individually accessible. The RAM 2 includes a first storage region 91 serving as a dynamic load area to which a program code stored in each of the blocks of the flash memory group 4 is exclusively loaded. Such program code transfer from the flash memory group 4 to the RAM 2 is executed, e.g., by the CPU 1 based on a program previously stored in the ROM 3.

Thus, the present invention is adapted to mutually exclusively load the plurality of program codes each corresponding to the respective one processing routine to the first storage region 91, requiring a smaller size of the RAM 2 than the size of the background art RAM shown in FIG. 4. Since the flash memory group 4 is rewritable, the firmware may be, of course, subjected to modification and version update. In this case, the required size of the RAM 2 is not increased. If a program code corresponding to a new additional processing routine is greater than the program code stored in each of the blocks of the flash memory group 4, the additional processing routine may be divided into parts which in turn are stored in blocks, respectively, of the flash memory group 4, whereby there is no need to change the size of the RAM 2.

The RAM 2 may further include a second storage region 92, in which case starting addresses of the blocks which store the program codes corresponding to the first to N-th processing routines, respectively, are also stored in the form of a table in the flash memory group 4. This table is loaded to the second storage region 92 of the RAM 2. Such table loading is required to be carried out only once, for example, at power-on, to save the time for reading a starting address from the flash memory group 4 each time a program code is loaded, thereby achieving rapid operation. Such table transfer from the flash memory group 4 to the RAM 2 is also executed, e.g., by the CPU 1 based on a program previously stored in the ROM 3.

It is desirable to execute error correction during the transfer of the program codes from the flash memory group 4 to the RAM 2. For example, an ECC (error checking and correcting) circuit 6 is connected to the flash bus 53 to store a program code called from the flash memory group 4 once in the buffer RAM 5 while performing the error correction on the program code. If there is no uncorrectable error in the program code, the program code is transferred from the buffer RAM 5 to the RAM 2. This precludes the program code in which an uncorrectable error occurs from being loaded to the RAM 2. Such an operation is also executed, e.g., by the CPU 1 based on a program previously stored in the ROM 3.

The capacity of the buffer RAM 5 is required to be as small as one program code having the largest size. Further, the buffer RAM 5 is accessible from the CPU 1 and the external host computer, and the CPU 1 and the external host computer can analyze the program code in which an uncorrectable error occurs.

The ROM 3 and the RAM 2 may, of course, store therein program codes and data other than those described above.

Figure 3:
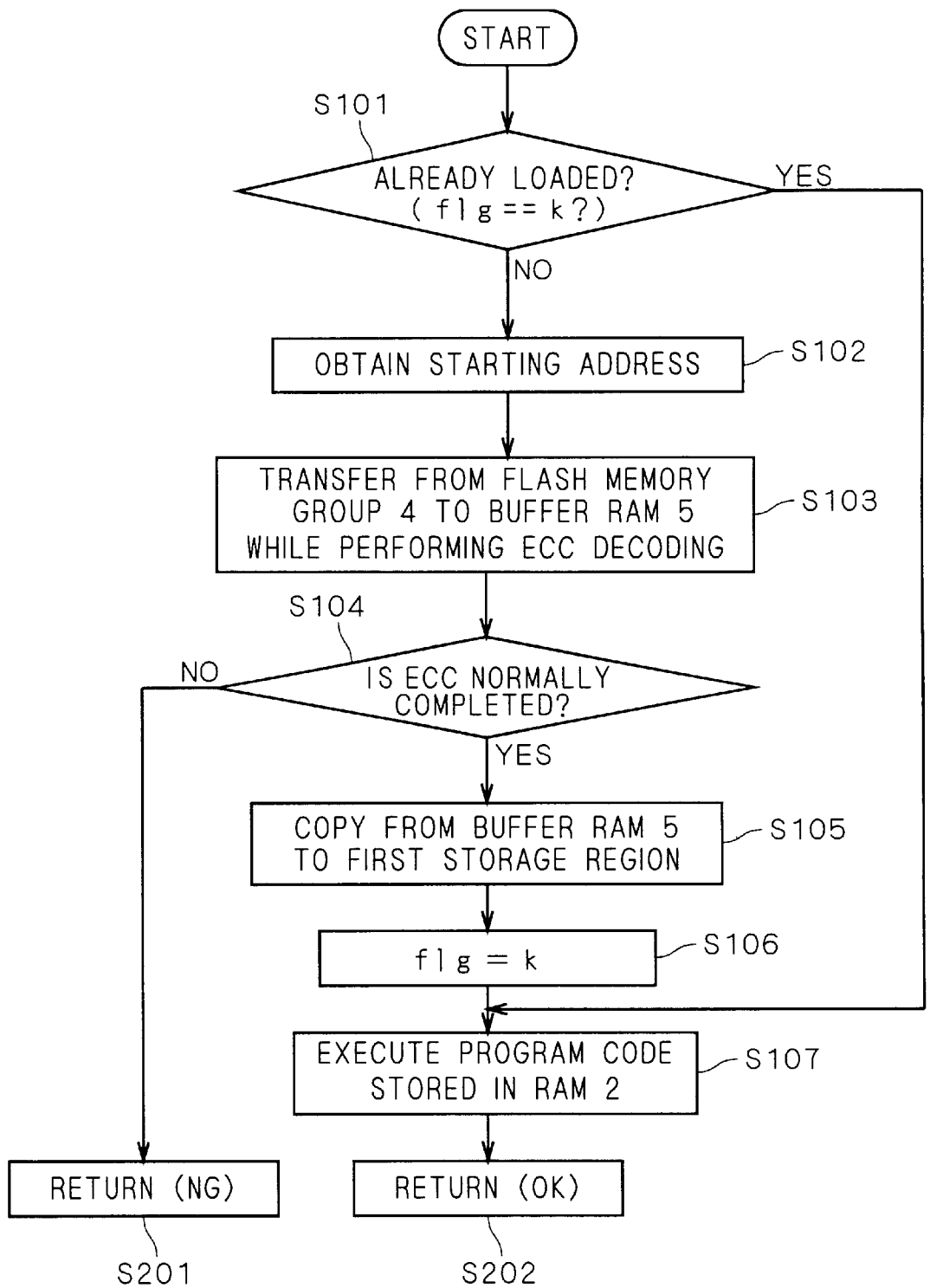
FIG. 3 is a flowchart showing the operation of the preferred embodiment of the present invention.

Detailed operation will be discussed below. FIG. 3 is a flowchart showing the operation of the flash ATA card 100 loading firmware to the RAM 2. The firmware loaded herein is a program code corresponding to a k-th processing routine where k=1 to N.

First, whether or not the program code corresponding to the k-th processing routine is stored in the first storage region 91 serving as the dynamic load area is checked in Step S101. More specifically, whether or not there is a match between the number of the processing routine corresponding to the already loaded program code and the number k of the processing routine to be executed is checked.

If the program code corresponding to the k-th processing routine is stored, new loading is not necessary and the flow proceeds to Step S107 in which the CPU 1 executes the program code stored in the first storage region 91. More specifically, the CPU 1 causes an address jump to the first storage region 91 to execute the program code. Then, the flow proceeds to Step S202 to return to a main routine for transition to other processing. At this time, information indicating, in the main routine to which the return is made, that the program code is normally stored is also transmitted (as indicated by "OK" in Step S202 of FIG. 3).

If it is judged in Step S101 that the program code corresponding to the k-th processing routine is not stored in the first storage region 91, it is necessary to store a new program code in the first storage region 91. Then, in Step S102, the table stored in the second storage region 92 is referred to, and the starting address of the block in which the program code corresponding to the k-th processing routine is stored is obtained from the table.

In Step S103, the program code corresponding to the k-th processing routine is obtained from the block starting at the obtained starting address, and is transferred to the buffer RAM 5 while being subjected to ECC processing (error correction). A judgement is made in Step S104 as to whether or not the ECC processing is normally completed. If the ECC processing is not normally completed, the flow proceeds to Step S201 to return to the main routine for transition to other processing. At this time, information indicating, in the main routine to which the return is made, that the program code is not normally stored is also transmitted (as indicated by "NG" in Step S201 of FIG. 3).

If the ECC processing is normally completed, the flow proceeds to Step S105 in which the program code stored in the buffer RAM 5 is copied to the first storage region 91. In step S106, the number k of the processing routine is substituted for a flag fig (although the substitution is indicated by the sign "=" in FIG. 3). Further, in Step S107, the CPU 1 executes the program code stored in the first storage region 91. Then, the flow proceeds to Step S202 to return to the main routine for transition to other processing.

In Step S101, whether or not the processing routine corresponding to the already loaded program code is a desired one is judged by making a comparison between the flag flg the value of which is determined in Step S106 and the number k of the processing routine to be executed (although the comparison is indicated by "= =" in FIG. 3).

The return is made in Steps S201 and S202 to an address pointer which has called a routine having the flowchart of FIG. 3.

The processing routines corresponding to the program codes individually stored in the flash memory group 4 may be associated with, for example, ATA command numbers, respectively. In this case, the processing routines corresponding to the program codes stored in the flash memory group 4 are to be individually executed in accordance with the ATA commands from the host computer. This facilitates the addition of a function without remaking the ROM and increasing the size of the RAM capacity if there arises a need for support of a new ATA command because of the necessity of a future review of specifications or the addition of an option.

In particular, the present invention is suitably applied when the controller 8 is a single chip controller, in which case remaking the ROM and increasing the size of the RAM capacity require an extensive process involving a mask change and are not readily carried out.

The present invention, of course, not only contribute to the ATA card but also may be similarly applied to other information processing devices comprising a RAM and flash memories, producing similar effects.

Additionally, a semiconductor disk device may be used as a flash memory so as to store bulk data.

While the invention has been described in detail, the foregoing description is in all aspects illustrative and not restrictive. It is understood that numerous other modifications and variations can be devised without departing from the scope of the invention.

What is claimed is:

1. A semiconductor memory comprising:
   a nonvolatile semiconductor storage section having a plurality of rewritable and individually accessible blocks for individually storing therein a plurality of program codes each corresponding to one of a plurality of processes;
   a RAM including a first storage region, wherein,
   said plurality of program codes are individually retrieved from said nonvolatile semiconductor storage section, and
   a plurality of program codes are individually loaded into said first storage region;
   an error correcting section connected between said RAM and said nonvolatile semiconductor storage section, wherein said error correcting section performs error correction upon one of said plurality of program codes while said one of said plurality of program codes is transferred to said RAM; and
   a central processing unit for executing said plurality of program codes, wherein,
   each of said plurality of program codes corresponds to a processing routine with a respectively assigned number,
   when an assigned number of a processing routine of a program code already loaded into said first storage region matches an assigned number of a processing routine of a program code to be executed, said program is executed by said central processing unit, and
   when the assigned number of the processing routine of the program code already loaded into said first storage region does not match the assigned number of the processing routine of the program code to be executed, a new program code to be executed is loaded into said first storage region, the new program code being one of the plurality of program codes.

2. The semiconductor memory according to claim 1, further comprising
   a ROM for storing therein a program for controlling the transfer of said plurality of program codes.

3. The semiconductor memory according to claim 2, further comprising
   a CPU for executing said transfer of said plurality of program codes, based on the program stored in said ROM.

4. The semiconductor memory according to claim 3, wherein said RAM, said ROM and said CPU are constructed on a single chip.

5. The semiconductor memory according to claim 1, further comprising
   a buffer RAM for temporarily storing therein said one of said plurality of program codes which is subjected to said error correction before said one of said plurality of program codes is transferred to said RAM.

6. The semiconductor memory according to claim 5, wherein said one of said plurality of program codes which is stored in said buffer RAM is not transferred to said RAM when an uncorrectable error occurs in said one of said plurality of program codes.

7. The semiconductor memory according to claim 1, wherein said nonvolatile semiconductor storage section includes a plurality of flash memories.

8. The semiconductor memory according to claim 1, wherein said RAM further includes a second storage region for storing therein a starting address of each of said plurality of blocks.

9. The semiconductor memory according to claim 8, wherein said starting address is transferred from said nonvolatile semiconductor storage section to said RAM.

10. The semiconductor memory according to claim 1, wherein each of said plurality of program codes is associated with a command provided from an outside of said semiconductor memory.

11. The semiconductor memory according to claim 10, further comprising an interface for receiving said command.

12. The semiconductor memory of claim 1, wherein a combined size of the plurality of program codes is greater than the capacity of the first storage region.

13. A semiconductor memory comprising:
   a nonvolatile semiconductor storage section having a plurality of rewritable, individually accessible blocks for individually storing therein a plurality of program codes each corresponding to one process, respectively:
   a RAM including a first storage region for storing at least one of said plurality of program codes therein; and
   an error correcting section connected between said RAM and said nonvolatile semiconductor storage section and for transferring one of said plurality of program codes to said RAM while performing error correction upon said one of said plurality of program codes, wherein:

said RAM further includes a second storage region for storing therein a starting address of each of said plurality of blocks, wherein said starting address is transferred from said nonvolatile semiconductor storage section to said RAM, a flag indicating that said one of said plurality of program codes is stored in said RAM is set, and when said flag is checked to show that said one of said plurality of program codes is not stored in said RAM, said starting address of one of said plurality of blocks which stores said one of said plurality of program codes is obtained from said second storage region, said one of said program codes is obtained from said one of said plurality of blocks which starts at said starting address and is transferred to said first storage region while being subjected to said error correction, said flag is made, and the program code stored in said first storage region is executed.

14. The semiconductor memory according to claim 13, wherein, when said flag is checked to show that said one of said plurality of program codes is stored in said RAM, the program code stored in said first storage region is executed.

15. The semiconductor memory according to claim 14, wherein said plurality of program codes have numbers assigned thereto, respectively, and said flag takes on values of the numbers of said plurality of program codes.

* * * * *